US012764977B2

(12) United States Patent
Kim et al.

(10) Patent No.: US 12,764,977 B2

(45) Date of Patent: Oct. 13, 2026

(54) CAPACITOR COMPONENT

(71) Applicant: SAMSUNG ELECTRO-MECHANICS CO., LTD., Suwon-si (KR)

(72) Inventors: Jae Hoon Kim, Suwon-si (KR); Hye Jin Kim, Suwon-si (KR); Gyoung Heon Ko, Suwon-si (KR); Jang Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 375 days.

(21) Appl. No.: 18/388,992

(22) Filed: Nov. 13, 2023

(65) Prior Publication Data

US 2024/0282807 A1 Aug. 22, 2024

(30) Foreign Application Priority Data

Feb. 16, 2023 (KR) ........................ 10-2023-0020727

(51) Int. Cl.

*H01L 23/522* (2006.01)
*H01G 4/08* (2006.01)
*H10D 1/00* (2025.01)
*H10D 1/68* (2025.01)
*H10W 20/40* (2026.01)

(52) U.S. Cl.

CPC ............. *H10D 1/042* (2025.01); *H10D 1/716* (2025.01); *H10W 20/496* (2026.01)

(58) Field of Classification Search

None

See application file for complete search history.

(56) References Cited

U.S. PATENT DOCUMENTS

2018/0308638 A1* 10/2018 Ryou ........................ H01G 4/33
2020/0035683 A1* 1/2020 Sharma .............. H10D 30/6729
2020/0135844 A1* 4/2020 Takahashi .............. H10D 1/696
2020/0294908 A1* 9/2020 Haba ................... H01L 23/5223
2021/0118618 A1* 4/2021 Shin ...................... H01L 23/642

FOREIGN PATENT DOCUMENTS

KR 10-2018-0119364 A 11/2018
KR 10-2021-0045226 A 4/2021

* cited by examiner

*Primary Examiner* — Lawrence C Tynes, Jr.

(74) *Attorney, Agent, or Firm* — Morgan, Lewis & Bockius LLP

(57) ABSTRACT

A capacitor component including: a first capacitor structure including a substrate having a plurality of first trenches disposed on one surface of the substrate, and a first capacitor layer disposed on the one surface of the substrate and inner walls of the plurality of first trenches, the first capacitor layer including a first dielectric layer and first and second electrodes disposed to face each other with the first dielectric layer interposed therebetween; a second capacitor structure disposed on the first capacitor structure, and including an insulating layer having a plurality of second trenches disposed on one surface of the insulating layer, and a second capacitor layer disposed on the one surface of the insulating layer and inner walls of the plurality of second trenches, the second capacitor layer including a second dielectric layer and third and fourth electrodes disposed to face each other with the second dielectric layer interposed therebetween.

20 Claims, 16 Drawing Sheets

I-I'

CAPACITOR COMPONENT

CROSS-REFERENCE TO RELATED APPLICATION (S)

This application claims benefit of priority to Korean Patent Application No. 10-2023-0020727 filed on Feb. 16, 2023 in the Korean Intellectual Property Office in the Korean Intellectual Property Office, the disclosure of which is incorporated herein by reference in its entirety.

TECHNICAL FIELD

The present disclosure relates to a capacitor component.

Recently, portable IT products such as smartphones, wearable devices, and the like, have been becoming thinner. As a result, the need for thinning passive elements to reduce the thickness of the overall package is also increasing. To this end, demand for thin film capacitors that can achieve a thinner thickness than multilayer ceramic capacitors (MLCC) is also increasing.

Such thin film capacitors have an advantage of having a low ESL, unlike conventional multilayer ceramic capacitors, and may be used as decoupling capacitors for application processors (AP), central processing units (CPU), or graphics processing units (GPU).

However, as an operating frequency and current consumption increase due to high performance such as AP, or the like, power impedance should be lowered to reduce a frequency of voltage fluctuations such as AP, or the like, and high-frequency noise. In particular, in order to lower the power impedance, it is necessary to further reduce ESL of a decoupling capacitor.

In addition, a thin film capacitor has a disadvantage of having lower capacitance compared to a mounting area than that of multilayer ceramic capacitors. In order to increase the capacitance of the thin film capacitor, it is possible to consider increasing the mounting area, but as the mounting area increases, there may be a problem in which cracks may easily occur. Therefore, there is a need for research on the thin film capacitor that can prevent cracks from occurring while improving the capacitance of the thin film capacitor within the same mounting area.

SUMMARY

An aspect of the present disclosure is to prevent cracks from occurring while improving capacitance of a capacitor component.

An aspect of the present disclosure is to reduce ESL of a capacitor component.

However, the purpose of the present disclosure is not limited to the above-described content, and may be more easily understood through description of specific embodiments of the present disclosure.

According to an aspect of the present disclosure, provided is a capacitor component, the capacitor component including: a first capacitor structure including a substrate having a plurality of first trenches disposed on one surface of the substrate, and a first capacitor layer disposed on the one surface of the substrate and inner walls of the plurality of first trenches, the first capacitor layer including a first dielectric layer and first and second electrodes disposed to face each other with the first dielectric layer interposed therebetween; a second capacitor structure disposed on the first capacitor structure, and including an insulating layer having a plurality of second trenches disposed on one surface of the insulating layer, and a second capacitor layer disposed on the one surface of the insulating layer and inner walls of the plurality of second trenches, the second capacitor layer including a second dielectric layer and third and fourth electrodes disposed to face each other with the second dielectric layer interposed therebetween; first and second wiring structures penetrating through the insulating layer; first and second external electrodes disposed on the insulating layer, and respectively connected to the first and second electrodes through the first and second wiring structures; and third and fourth external electrodes disposed on the insulating layer, and respectively connected to the third and fourth electrodes.

According to another aspect of the present disclosure, provided is a capacitor component, the capacitor component including: a first capacitor structure including a substrate having a plurality of first trenches disposed on one surface of the substrate, and a first capacitor layer disposed on the one surface of the substrate and inner walls of the plurality of first trenches, the first capacitor layer including a first dielectric layer and first and second electrodes disposed to face each other with the first dielectric layer interposed therebetween; and a second capacitor structure disposed on the first capacitor structure, and including an insulating layer having a plurality of second trenches disposed on one surface of the insulating layer, and a second capacitor layer disposed on the one surface of the insulating layer and inner walls of the plurality of second trenches, the second capacitor layer including a second dielectric layer and third and fourth electrodes disposed to face each other with the second dielectric layer interposed therebetween, wherein the insulating layer includes silicon oxide, and when an interval between adjacent trenches among the plurality of first trenches is D1, an interval between adjacent trenches among the plurality of second trenches is D2, a depth of a trench among the plurality of first trenches is T1, and a depth of a trench among the plurality of second trenches is T2, $D1>D2$ and/or $T1>T2$ are satisfied.

BRIEF DESCRIPTION OF DRAWINGS

The above and other aspects, features, and advantages of the present disclosure will be more clearly understood from the detailed following description, taken in conjunction with the accompanying drawings.

DETAILED DESCRIPTION

Figure 1:
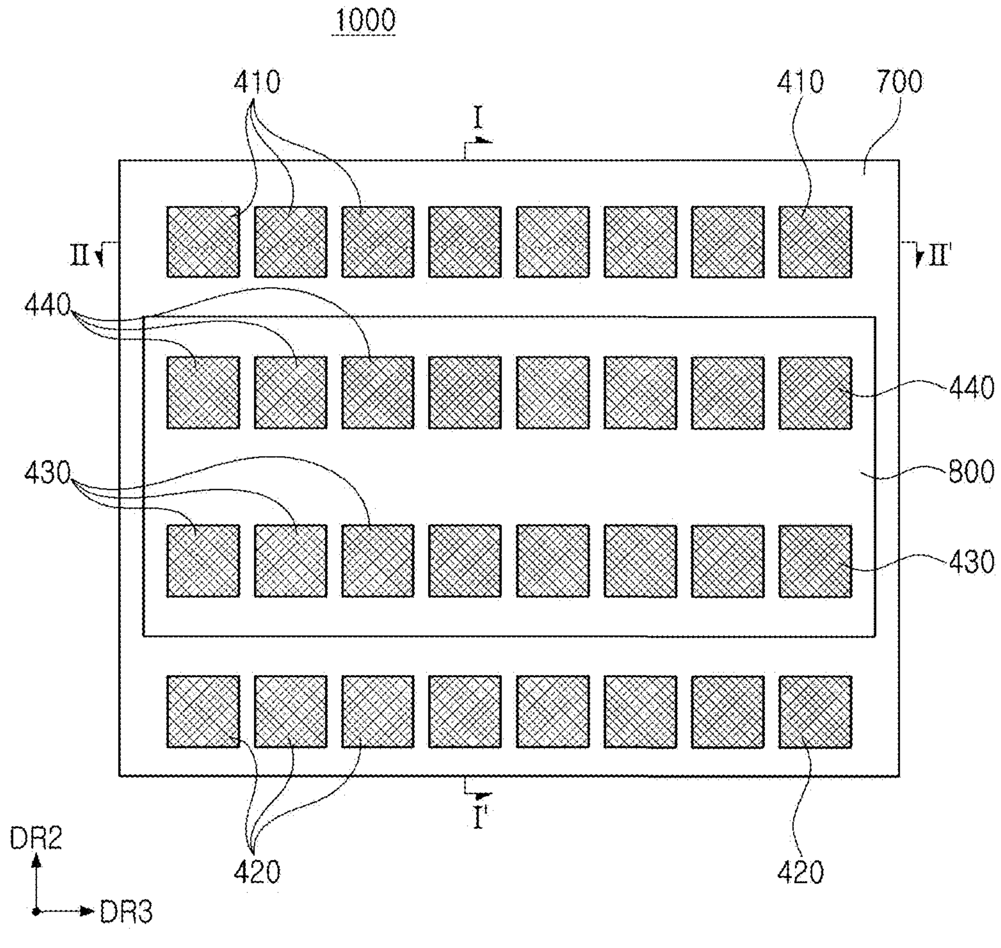
FIG. 1 is a plan view schematically illustrating a capacitor component according to an embodiment of the present disclosure.

Hereinafter, embodiments of the present disclosure will be described with reference to specific example embodiments and the attached drawings. The embodiments of the present disclosure may, however, be exemplified in many different forms and should not be construed as being limited to the specific embodiments set forth herein. The example embodiments disclosed herein are provided for those skilled in the art to better explain the present disclosure. In the drawings, the shapes and dimensions of elements may be exaggerated for clarity, and the same reference numerals will be used throughout to designate the same or like elements.

In addition, in order to clearly describe the present disclosure in the drawings, the contents unrelated to the description are omitted, and since sizes and thicknesses of each component illustrated in the drawings are arbitrarily illustrated for convenience of description, the present disclosure is not limited thereto. In addition, components with the same function within the same range of ideas are described using the same reference numerals. Throughout the specification, when a certain portion "includes" or "comprises" a certain component, this indicates that other components are not excluded and may be further included unless otherwise noted.

Figure 2:
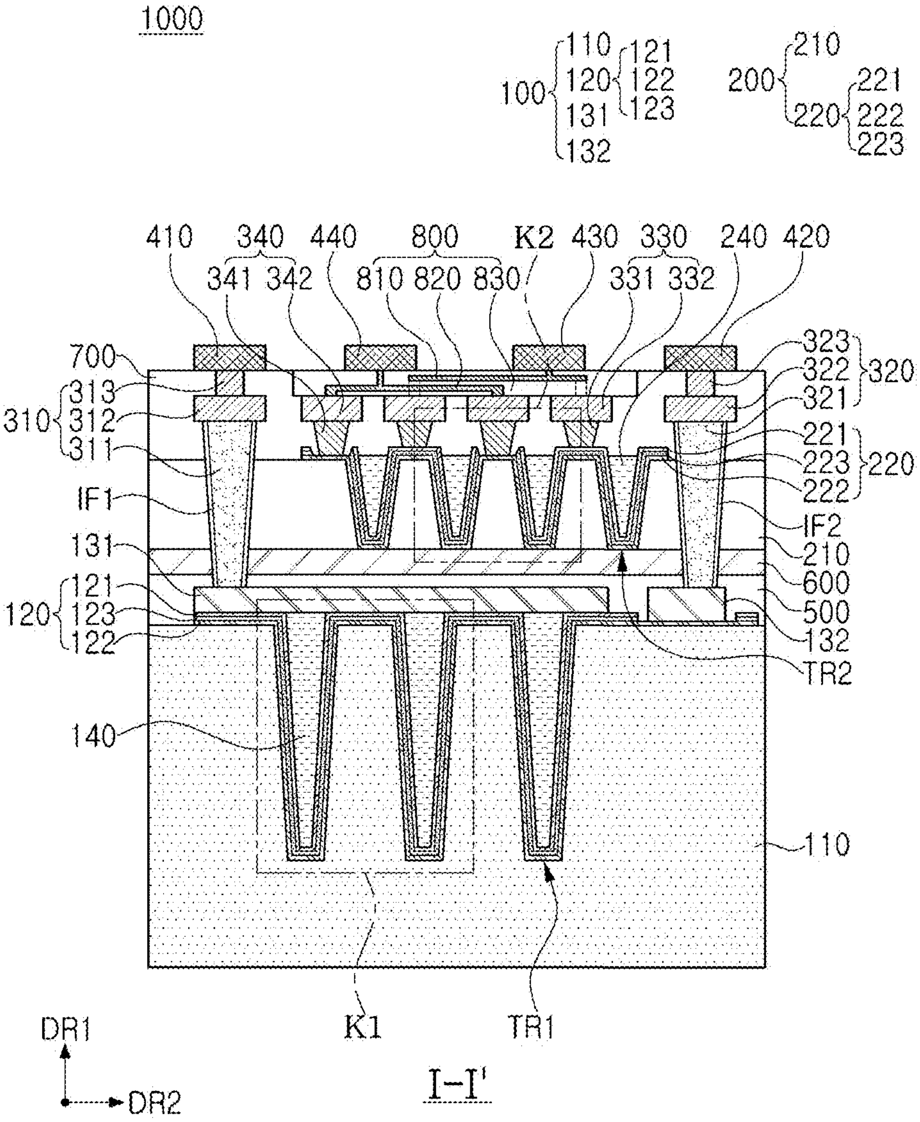
FIG. 2 is a cross-sectional view schematically illustrating a cross-section taken along line I-I' in FIG. 1.
Figure 3:
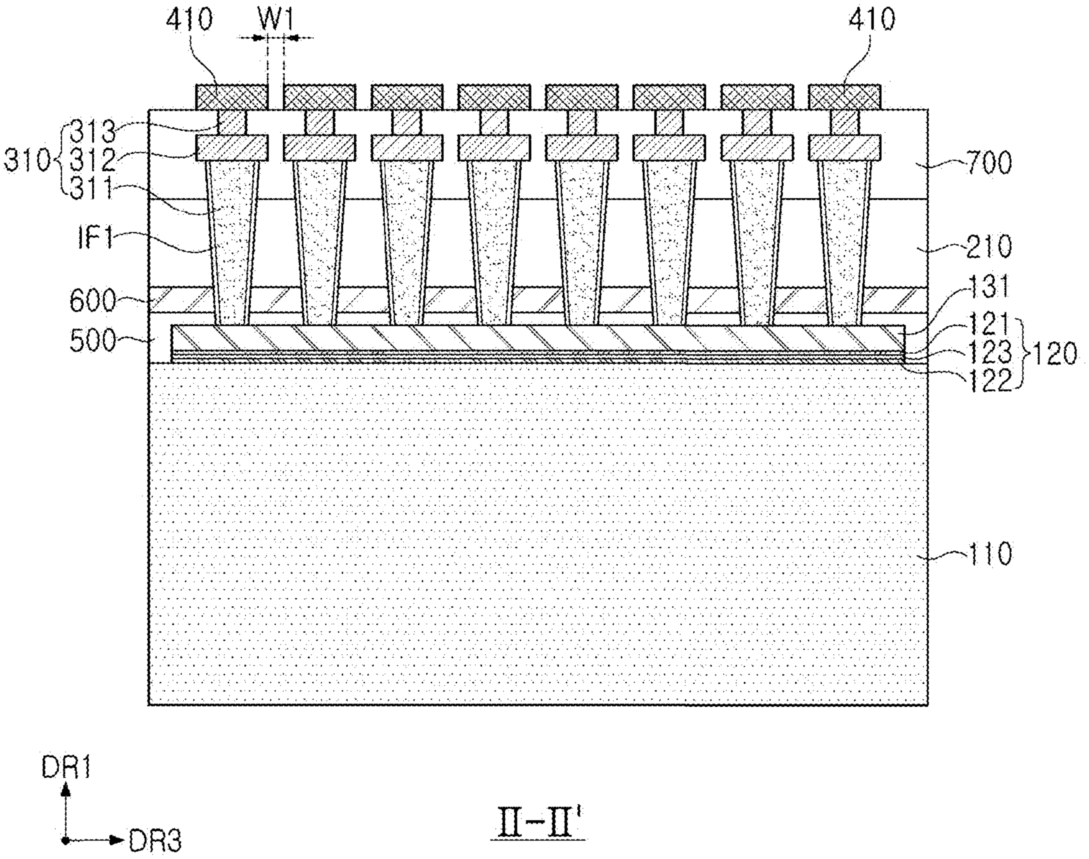
FIG. 3 is a cross-sectional view schematically illustrating a cross-section taken along line II-II' in FIG. 1.
Figure 4:
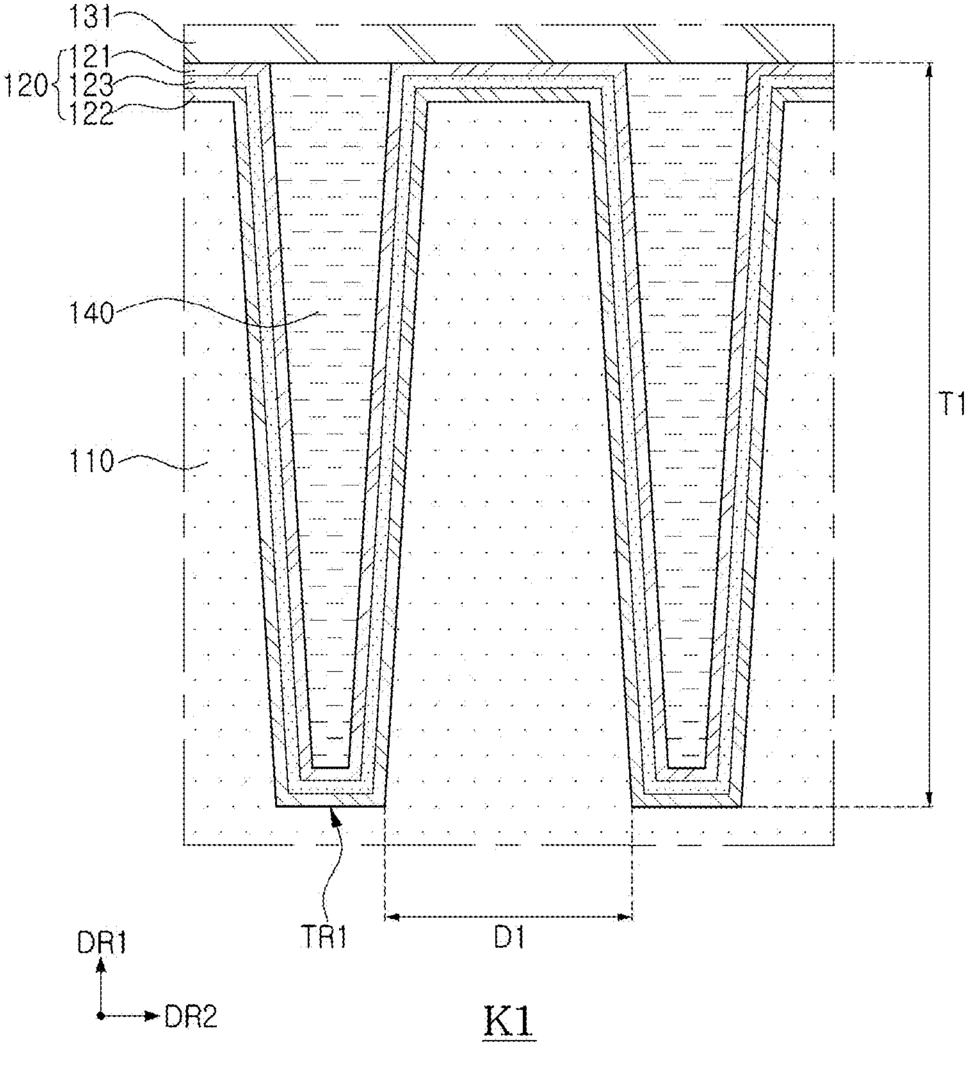
FIG. 4 is an enlarged view of region K1 in FIG. 2.
Figure 5:
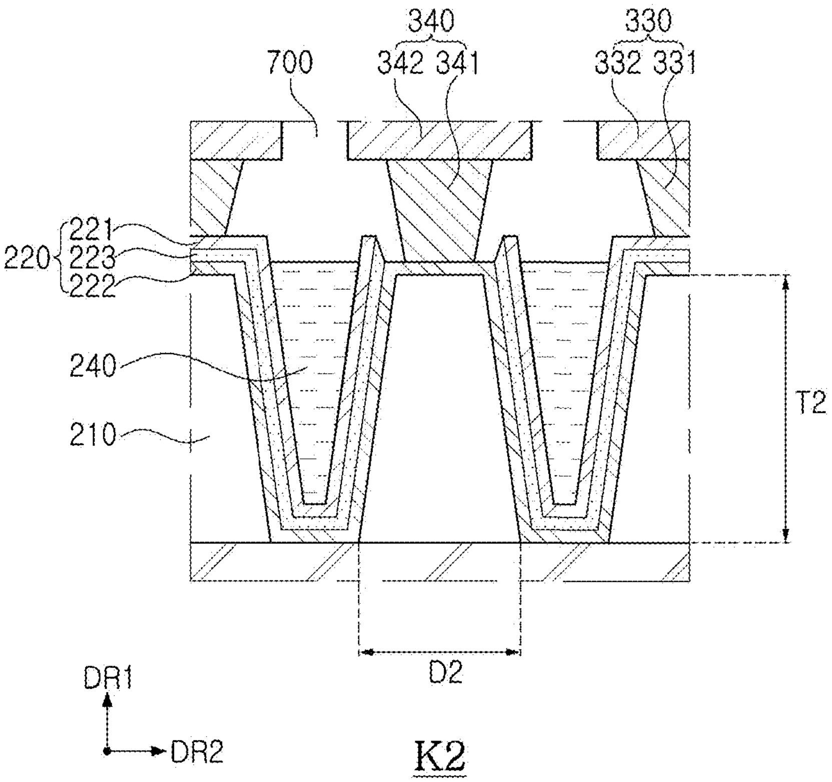
FIG. 5 is an enlarged view of region K2 in FIG. 2.

FIG. 1 is a plan view schematically illustrating a capacitor component according to an embodiment of the present disclosure. FIG. 2 is a cross-sectional view schematically illustrating a cross section taken along line I-I' of FIG. 1. FIG. 3 is a cross-sectional view schematically illustrating a cross-section taken along line II-II' of FIG. 1. FIG. 4 is an enlarged view of region K1 in FIG. 2. FIG. 5 is an enlarged view of region K2 in FIG. 2.

Referring to FIGS. 1 to 5, a capacitor component 1000 according to an embodiment of the present disclosure includes a first capacitor structure 100 and a second capacitor structure 200 disposed on the first capacitor structure.

The first capacitor structure 100 may include a substrate 110 having a plurality of first trenches TR1 disposed on one surface of the substrate. A type of the substrate 110 is not particularly limited, but the substrate 110 may be a silicon substrate. For example, the silicon substrate may be a silicon wafer, and the silicon wafer has an advantage of less change in physical and mechanical properties due to temperature changes, lowering manufacturing costs. A shape of the substrate 110 is not particularly limited, but the substrate 110 may generally have a rectangular parallelepiped shape.

The plurality of first trenches TR1 disposed on the one surface of the substrate 110 may penetrate into the substrate 110 based on a first direction DR1. In addition, the plurality of first trenches TR1 may be disposed to be spaced apart from each other in, for example, a second direction DR2, and each of the first trenches TR1 may extend, for example, in a third direction DR3. Meanwhile, as illustrated in FIG. 2, when the substrate 110 is viewed from a planar perspective view, the first trench TR1 may have a square shape, a trapezoidal shape, and the like, but the present disclosure is not limited thereto, and a bottom surface of the first trench TR1 may have a convex curved surface toward a lower surface of the substrate 110.

Referring to FIG. 2, the first capacitor structure 100 may include a first capacitor layer 120 disposed on one surface of the substrate 110 and inner walls of the plurality of first trenches TR1, and including a first dielectric layer 123 and first and second electrodes 121 and 122 disposed to face each other with the first dielectric layer 123 interposed therebetween.

The second electrode 122 may contact an upper surface of the substrate 110 and inner walls of the plurality of first trenches TR1. That is, the second electrode 122 may conformally cover the upper surface of the substrate 110 and the inner walls of the plurality of first trenches TR1. In addition, the first dielectric layer 123 and the first electrode 121 may be sequentially stacked on the second electrode 122. That is, the first electrode 121 and the second electrode 122 are disposed to face each other with the first dielectric layer 123 interposed therebetween, so that a first capacitor layer 120 having a metal-insulator-metal (MIM) structure may be formed, and capacitance of the first capacitor structure 100 may be formed by applying voltages of different polarities to the first electrode 121 and the second electrode 122.

For example, the first electrode 121 and the second electrode 122 may be a metal film, a metal oxide film, a metal nitride film, and/or a metal oxynitride film, respectively. The first electrode 121 and the second electrode 122 may include, for example, Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, and/or Sn oxynitride, and may include one or more of TiN, CON, NbN, and $SnO_2$, but the present disclosure is not limited thereto.

The first dielectric layer 123 may be a metal oxide film having paradielectric properties. The first dielectric layer 123 may include, for example, one or more of $AlO_2$, $ZrO_2$, $HfO_2$, $Nb_2O_5$, $CeO_2$, and $TiO_2$. In addition, the first dielectric layer 123 may be formed as a composite layer in which a plurality of metal oxide films are stacked to improve electrical leakage characteristics, and, for example, the first dielectric layer 123 may have a form in which $ZrO_2$—$Al_2O_3$—$ZrO_2$ metal films are sequentially stacked.

In addition, an interior of the plurality of first trenches TR1 may be filled with a first conductive filler 140. The first conductive filler 140 may serve to prevent cracks from occurring by filling an empty space inside the first trench TR1. A type of the first conductive filler 140 is not particularly limited, but for example, the first conductive filler 140 may include TiN.

The first capacitor structure 100 may include a first connection electrode 131 disposed to be in contact with the first electrode 121 and a second connection electrode 132 disposed to be in contact with a region exposed to one surface of the substrate 110 among the second electrode 122. The first connection electrode 131 may serve to connect the first electrode 121 and a first wiring structure 310 to be described later, and the second connection electrode 132 may serve to connect the second electrode 122 and a second wiring structure 320 to be described later. The first connection electrode 131 may be disposed on the first capacitor layer 120 to cover the plurality of first trenches TR1 from above, but the present disclosure is not limited thereto. The second connection electrode 132 may be electrically insulated from the first electrode 121 by an intermediate insulating film 500, to be described later. The first and second connection electrodes 131 and 132 may be formed of a conductive metal and/or a conductive semiconductor material, but the present disclosure is not limited thereto.

Meanwhile, in order to increase capacitance formed in the first capacitor structure 100, a method of increasing a depth of the first trench TR1, or increasing a size of the substrate 110 in second and/or third directions may be considered. However, there is a limit to improving capacitance due to structural limitations of the first trench TR1, and as the depth of the first trench TR1 is increased, or the size of the substrate 110 in the second and/or third directions are increased, there may be a problem in which cracks easily occur in the capacitor component 1000.

On the other hand, in the capacitor component 1000 according to an embodiment of the present disclosure, a second capacitor structure 200 may be disposed on the first capacitor structure 100, so that the capacitance of the capacitor component 1000 may be improved, and crack occurrence may be effectively prevented.

According to an embodiment of the present disclosure, the second capacitor structure 200 may include an insulating layer 210 having a plurality of second trenches TR2 disposed on one surface of the insulating layer 210. The plurality of second trenches TR2 disposed on the one surface of the insulating layer 210 may penetrate into the insulating layer 210 based on a first direction DR1. In addition, the plurality of second trenches TR2 may be disposed to be spaced apart from each other in, for example, a second direction, and each of the second trenches TR2 may extend, for example, in a third direction.

Referring to FIG. 2, the second capacitor structure 200 may be disposed on one surface of the insulating layer 210 and inner walls of the plurality of second trenches TR2, and may include a second capacitor layer 220 including a second dielectric layer 223 and third and fourth electrodes 221 and 222 disposed to face each other with the second dielectric layer interposed therebetween.

The fourth electrode 222 may contact an upper surface of the insulating layer 210 and inner walls of the plurality of second trenches TR2. That is, the fourth electrode 222 may conformally cover the upper surface of the insulating layer 210 and the inner walls of the plurality of second trenches TR2. In addition, the second dielectric layer 223 and the third electrode 221 may be sequentially stacked on the fourth electrode 222. Capacitance of the second capacitor structure 200 may be formed by applying voltages of different polarities to the third electrode 221 and the fourth electrode 222. That is, according to an embodiment of the present disclosure, the first capacitor structure 100 and the second capacitor structure 200 may be stacked in the first direction DR1, so that greater capacitance may be implemented within the same mounting area.

A type of the insulating layer 210 is not particularly limited, but the insulating layer 210 may include, for example, silicon oxide. When the insulating layer 210 is a silicon oxide film, a second trench TR2 may be formed through a finer process than that of the substrate 110, and thus a depth of the second trench TR2 may be finely controlled so that the capacitance of the capacitor component 1000 may be improved and crack occurrence may be effectively prevented.

The third and fourth electrodes 221 and 222 may include the same material as the first and second electrodes 121 and 122, and may include, for example, one or more of TiN, CON, NbN, and $SnO_2$, but the present disclosure is not limited thereto. The second dielectric layer 223 may include the same material as the first dielectric layer 123, and may include, for example, one or more of $AlO_2$, $ZrO_2$, $HfO_2$, $Nb_2O_5$, $CeO_2$, and TiO, but the present disclosure is not limited thereto.

In an embodiment, an interior of the plurality of second trenches TR2 may be filled with a second conductive filler 240. The second conductive filler 240 may serve to fill an empty space inside the second trench TR2 to prevent cracks from occurring. For example, the second conductive filler 240 may include the same material as the first conductive filler 140.

In an embodiment, the capacitor component may include an intermediate insulating film 500 disposed to cover the first capacitor structure and including silicon oxide. In addition, the capacitor component may include an film 600 between the intermediate metal disposed intermediate insulating film 500 and the second capacitor structure 200. In this case, the plurality of second trenches TR2 may penetrate through the insulating layer 210, and a fourth electrode 222 and an intermediate metal film 600 may contact lower surfaces of the plurality of second trenches TR2. The intermediate insulating film 500 may include, for example, $SiO_2$, and the intermediate metal film 600 may include, for example, TiN, but the present disclosure is not limited thereto.

Referring to FIGS. 4 and 5, in an embodiment, when a gap between the plurality of first trenches TR1 is D1, a gap between the plurality of second trenches TR2 is D2, a depth of the first trench TR1 is T1, and a depth of the second trench TR2 is T2, D1>D2 and/or T1>T2 may be satisfied. D1, D2, T1, and T2 may be measured using an optical microscope or an electron microscope. Other methods and/or tools appreciated by one of ordinary skill in the art, even if not described in the present disclosure, may also be used.

As described above, when the insulating layer 210 includes silicon oxide, a second trench TR2 may be formed through a finer process than that of the substrate 110. Accordingly, the depth T2 of the second trench TR2 may be formed to be smaller than the depth of the first trench TR1, and as a result, the second capacitor structure 200 may have a crack occurrence risk lower than that of the first capacitor structure 100. In addition, through a fine process, the gap D2 between the plurality of second trenches TR2 may be formed to be smaller than the gap D1 between the plurality of first trenches TR1, and as a result, by increasing the number of the second trenches TR2, the crack occurrence risk may be lowered, and the capacitance of the second capacitor structure 200 may be secured above a certain level.

A ratio between T1 and T2 is not particularly limited. For example, in the case of a capacitor component for high-voltage electrical equipment or when the size of the capacitor component in the second and third directions is large and crack occurrence prevention is important, by reducing the size of the substrate 110 in the first direction and the depth T1 of the first trench TR1 and increasing the size of the insulating layer 210 in the first direction and the depth T2 of the second trench TR2, the occurrence of cracks may be suppressed. In addition, in the case of high-capacitance small-sized capacitor components, the capacitance of the capacitor component can be maximized by increasing the size of the substrate 110 in the first direction and the depth T1 of the first trench TR1. For example, T1 may be several tens of micrometers (μm), and T2 may be several micrometers (μm) or less, but the present disclosure is not limited thereto.

The capacitor component 1000 according to an embodiment of the present disclosure may include first and second external electrodes 410 and 420 disposed on the insulating layer 210 and respectively connected to the first and second electrodes 121 and 122, and third and fourth external electrodes 430 and 440 disposed on the insulating layer 210 and respectively connected to the third and fourth electrodes 221 and 222. According to an embodiment of the present disclosure, by being respectively connected to the first to fourth electrodes 121, 122, 221, and 222, and including the first to fourth external electrodes 410, 420, 430, and 440, spaced apart from each other, ESL of the capacitor component 1000 may be reduced. That is, compared to the case in which the first electrode 121 and the third electrode 221 are electrically connected to each other and the second electrode 122 and the fourth electrode 224 are electrically connected to each other to have two external electrodes, the ESL may be reduced more effectively.

As illustrated in FIG. 1, a plurality of first to fourth external electrodes 410, 420, 430, and 440 may respectively be disposed. For example, as illustrated in FIG. 3, a plurality of first external electrodes 410 may be connected to one first electrode 121 through a plurality of first wiring structures 310. As described above, ESL of the capacitor component may be reduced by increasing the number of first external electrodes 410 narrowing an interval W1 between the first external electrodes 410. Meanwhile, although not illustrated, a plurality of second external electrodes 420 may be connected to one second electrode 122 through a plurality of second wiring structures 320. In addition, a plurality of third external electrodes 430 may be connected to one third electrode 221 through the circuit layer 800, and a plurality of fourth external electrodes 440 may be connected to one fourth electrode 222 through the circuit layer 800.

For example, the first and second external electrodes 410 and 420 may be respectively connected to the first and second electrodes 121 and 122 through the first and second wiring structures 310 and 320 penetrating through the insulating layer 210.

It is sufficient for the first wiring structure 310 to electrically connect the first electrode 121 and the first external electrode 410, and a structure thereof is not particularly limited. However, for example, the first wiring structure 310 may include a first via electrode 311 penetrating through the insulating layer 210, and having one end thereof in contact with the first connection electrode 131, and a plurality of first wiring layers 312 and 313 stacked on the first via electrode. Likewise, the second wiring structure 320 may include a second via electrode 321 penetrating through the insulating layer 210, and having one end thereof in contact with the second connection electrode 132, and a plurality of second wiring layers 322 and 323 stacked on the second via electrode.

The via electrodes 311 and 321 may serve to electrically connect first and second electrodes 121 and 122 disposed further below the insulating layer 210 and first and second external electrodes 410 and 420 disposed further above the insulating layer 210. The structure, number, and/or size of the plurality of first and second wiring layers 312, 313, 322, and 323 are not particularly limited, and it is sufficient if lower surfaces of the first and second external electrodes 410 and 420 and lower surfaces of the third and fourth external electrodes 430 and 440 may be disposed to be coplanar. Meanwhile, the via electrodes 311 and 321 and the plurality of first and second wiring layers 312, 313, 322, and 323 may include a conductive metal, for example, Cu, but the present disclosure is not limited thereto.

In addition, a first separator IF1 may be disposed on an outer surface of the first via electrode 311, and a second separator IF2 may be disposed on an outer surface of the second via electrode 321. The separators IF1 and IF2 may serve to ensure insulating properties with regard to other components except for the via electrodes 311 and 321 and the first electrode 121 or the second electrode 122. For example, the separator IF1 and IF2 may be a metal oxide film, and may include one or more of $AlO_2$, $ZrO_2$, $HfO_2$, $Nb_2O_5$, $CeO_2$, and $TiO_2$, but the present disclosure is not limited thereto.

There is no need to specifically limit a method of connecting the second capacitor layer 220 and the third and fourth external electrodes 430 and 440. For example, the capacitor component 1000 may further comprise a plurality of third wiring structures connecting the third electrode and the third external electrode, and spaced apart from each other, a plurality of fourth wiring structures connecting the fourth electrode and the fourth external electrode, and spaced apart from each other, and a circuit layer connecting the plurality of third wiring structures and the third external electrode, and connecting the plurality of fourth wiring structures and the fourth external electrode.

The third wiring structure 330 and the fourth wiring structure 340 may be disposed on the insulating layer 210, and may be alternately disposed in a second direction. For example, the third wiring structure 330 may be disposed on the second capacitor layer 220, and be disposed to be in contact with the third electrode 221. The fourth wiring structure 340 may be disposed to contact a region of the fourth electrode 222 exposed on one surface of the insulating layer 210. The third wiring structure 330 may include a plurality of third wiring layers 331 and 332 stacked in a first direction, and the fourth wiring structure 340 may include a plurality of fourth wiring layers 341 and 342 stacked in a first direction. The structure, number, or size of the plurality of third and fourth wiring layers are not particularly limited, and it is sufficient if lower surfaces of the first and second external electrodes 410 and 420 and lower surfaces of the third and fourth external electrodes 430 and 440 may be disposed to be coplanar.

The capacitor component 1000 according to an embodiment of the present disclosure may include a plurality of third wiring structures 330 connected to one third electrode 221, and a plurality of fourth wiring structures 340 connected to one fourth electrode 222, so that the ESL of the capacitor component 1000 may be more effectively reduced, compared to the case in which one third wiring structure 330 or one fourth wiring structure 340 is disposed.

The circuit layer 800 may include a first circuit pattern 810 connecting the plurality of third wiring structures 330 and the third external electrode 430, and a second circuit pattern 820 connecting the plurality of fourth wiring structures 340 and the fourth external electrode 440. A lower surface of the circuit layer 800 may be in contact with the plurality of third wiring structures 330 and the plurality of fourth wiring structures 340, and an upper surface of the circuit layer 800 may be in contact with the third and fourth external electrodes 430 and 440, but the present disclosure is not limited thereto. In addition, the first circuit pattern 810 and the second circuit pattern 820 may be disposed within an insulating body 830. It is sufficient for the insulating body 830 to be formed of an insulating material, and may have the same components as the insulating layer 210, but the present disclosure is not limited thereto.

The first circuit pattern 810 may include a plurality of lead-out portions exposed to a lower surface of the circuit layer 800, and each lead portion exposed to the lower surface of the circuit layer may be connected to one third wiring structure 330. In addition, the first circuit pattern 810 may include a lead-out portion exposed to an upper surface of the circuit layer 800, and the lead-out portion exposed to the upper surface of the circuit layer may be connected to the third external electrode 430.

The second circuit pattern 820 may include a plurality of lead-out portions exposed to a lower surface of the circuit layer 800, and each lead-out portion exposed to the lower surface of the circuit layer may be connected to one fourth wiring structure 340. In addition, the second circuit pattern 820 may include a lead-out portion exposed to an upper surface of the circuit layer 800, and the lead-out portion exposed to the upper surface of the circuit layer may be connected to the fourth external electrode 440.

In an embodiment, the capacitor component 1000 may further comprise an upper insulating film 700 disposed between an upper surface of the insulating layer 210 and lower surfaces of the first to fourth external electrodes 410, 420, 430, and 440 and covering at least portions of the first and second wiring structures 310 and 320. In addition, the upper insulating film 700 may be disposed to cover at least portions of the third wiring structure 330, the fourth wiring structure 340, and the circuit layer 800. That is, the first wiring structure 310 and the second wiring structure 320 may penetrate through the upper insulating film 700, and the third wiring structure 330, the fourth wiring structure 340, and the circuit layer 800 may be disposed inside the upper insulating film 700. The upper insulating film 700 may have the same structure as the insulating layer 210, and may include silicon oxide.

FIGS. 6 to 18 are cross-sectional views of main processes for illustrating a method of manufacturing a capacitor component according to an embodiment of the present disclosure. Hereinafter, an exemplary manufacturing method of a capacitor component 1000 according to an embodiment of the present disclosure will be described with reference to FIGS. 6 to 18.

Figure 6:
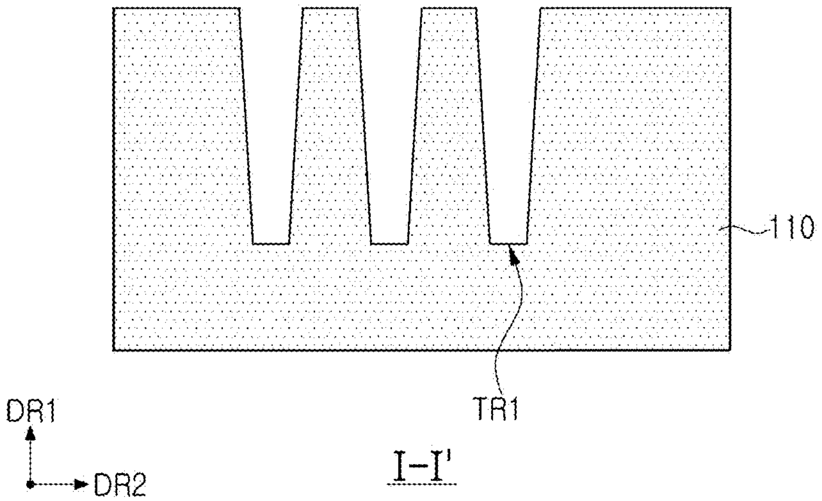
FIGS. 6 to 18 are cross-sectional views of main processes for illustrating a method of manufacturing a capacitor component according to an embodiment of the present disclosure.

First, referring to FIG. 6, after preparing a substrate 110, an upper surface of the substrate 110 may be etched using a mask pattern and etching equipment to form a plurality of first trenches TR1 penetrating into the substrate 110 based on a first direction DR1.

Figure 7:
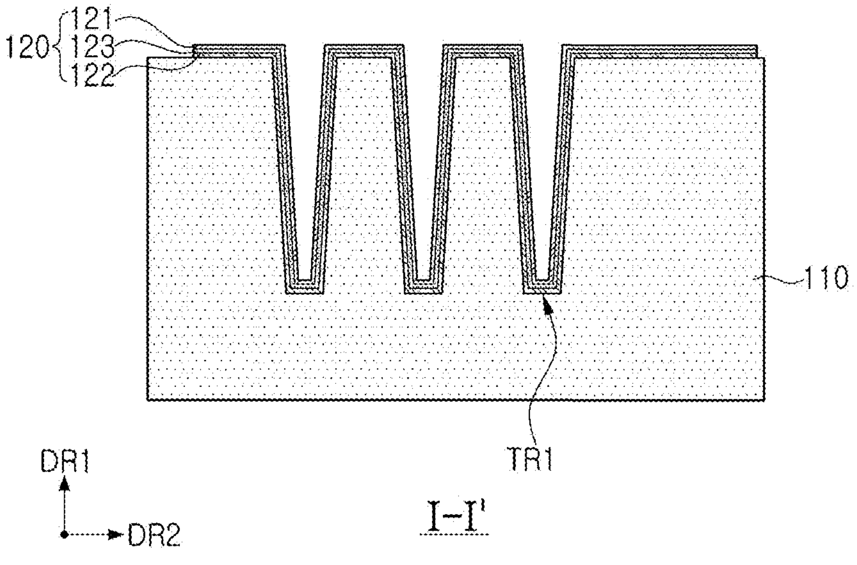

Next, as illustrated in FIG. 7, a first capacitor layer 120 including a first dielectric layer 123 along an upper surface of the substrate 110 and inner walls of the plurality of first trenches TR1, and first and second electrodes 121 and 122 disposed to face each other with the first dielectric layer interposed therebetween may be formed. The first electrode 121, the second electrode 122, and the first dielectric layer 123 may be formed, for example, on the upper surface of the substrate 110 and the inner wall of the plurality of first trenches TR1 by an Atomic Layer Deposition (ALD) or Atomic Vapor Deposition (AVD) process.

Figure 8:
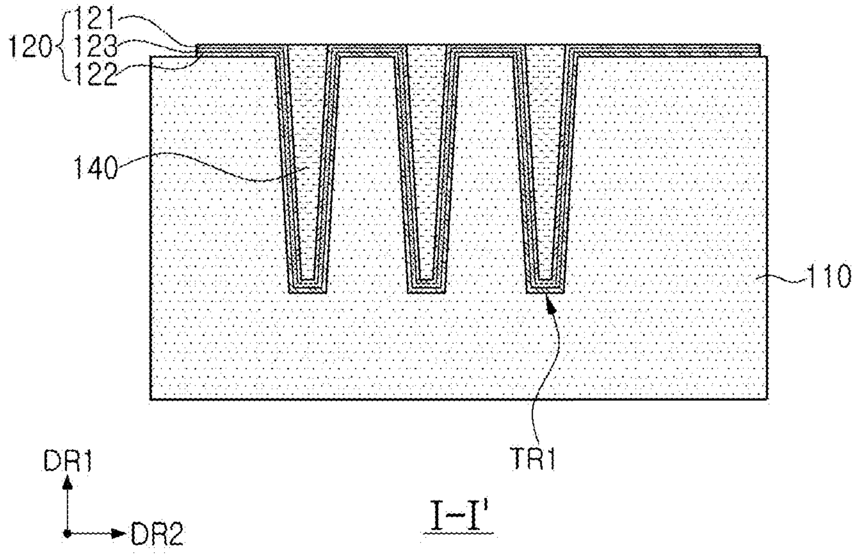

Thereafter, as illustrated in FIG. 8, after forming the first capacitor layer 120, a first conductive filler 140 may be formed to fill an empty space inside the plurality of first trenches TR1. The first conductive filler may be formed by depositing a conductive material such as TiN, or the like using a plating method, sputtering method, or the like.

Figure 9:
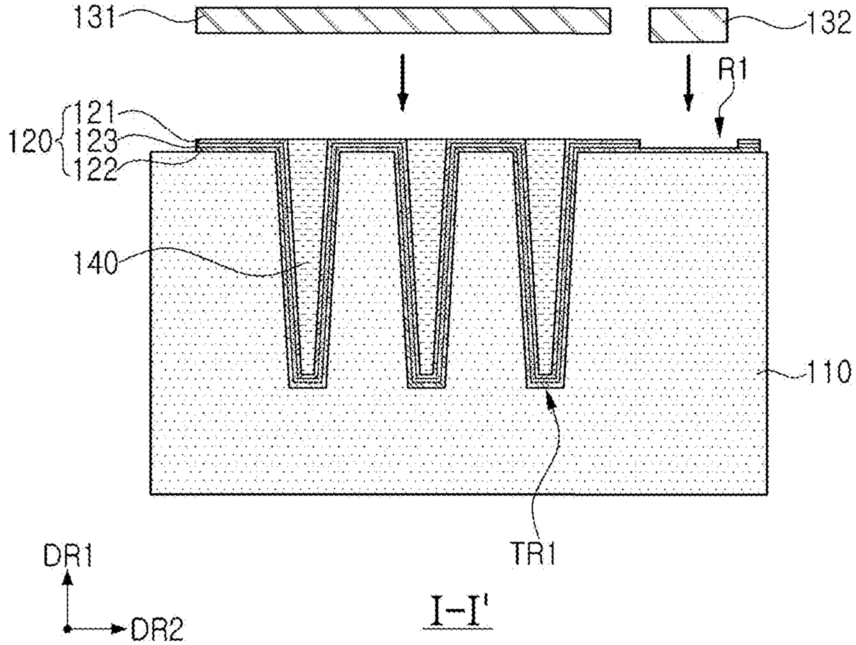

Next, as illustrated in FIG. 9, a first connection electrode 131 in a form of a plate may be formed on the first electrode 121. In addition, in a partial region R1 of the first capacitor layer 120 disposed on an upper surface of the substrate 110, after exposing a second electrode 122 by removing the first electrode 121 and the first dielectric layer 123 to the upper surface of the substrate 110, a second connection electrode 132 in a form of a plate may be formed in the partial region R1 of the first capacitor layer to connect the second connection electrode 132 and the second electrode 122. Meanwhile, a size of the partial region R1 of the first capacitor layer in a second direction is preferably larger than a size of the second connection electrode 132 in the second direction.

Figure 10:
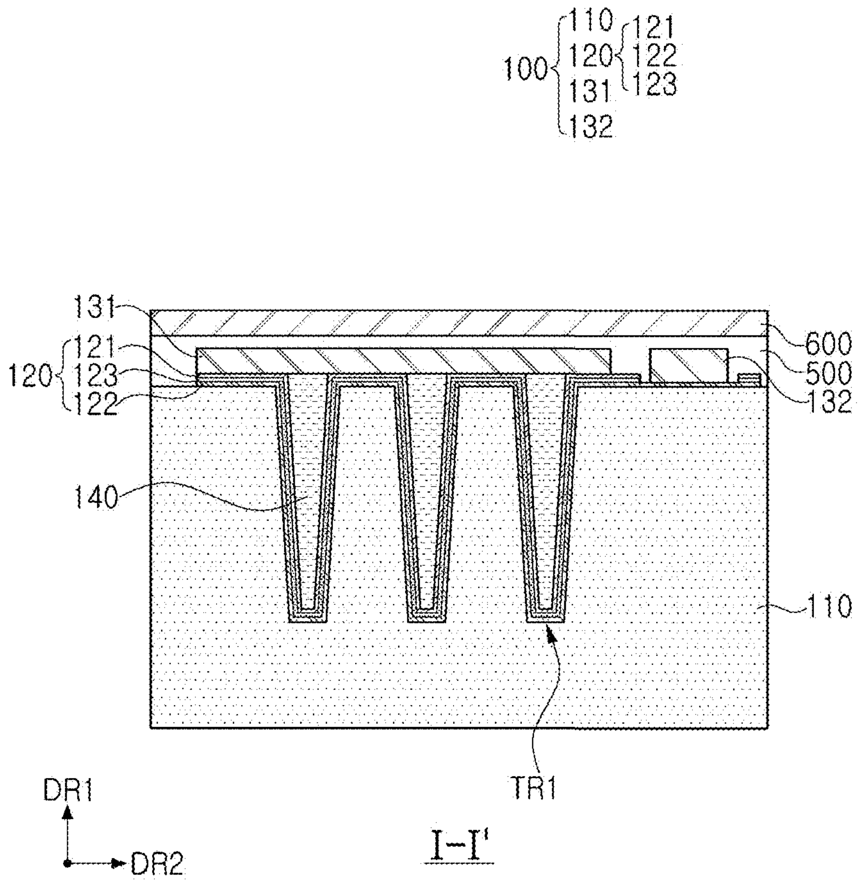

Next, as illustrated in FIG. 10, an intermediate insulating film 500 may be formed to cover a first capacitor structure 100. The intermediate insulating film 500 may be formed, for example, by depositing silicon oxide on the first capacitor structure 100. In addition, an intermediate metal film 600 may be formed on the intermediate insulating film 500. The intermediate metal film 600 can be formed using, for example, a plating method, a sputtering method, or the like.

Figure 11:
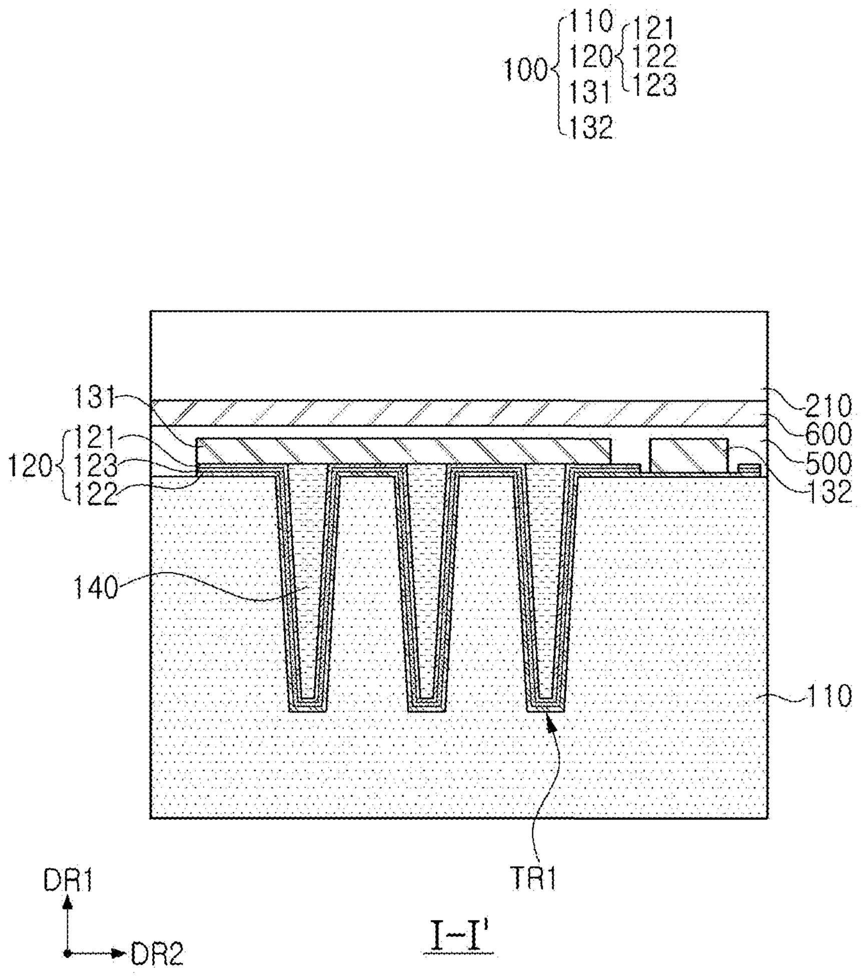
Figure 12:
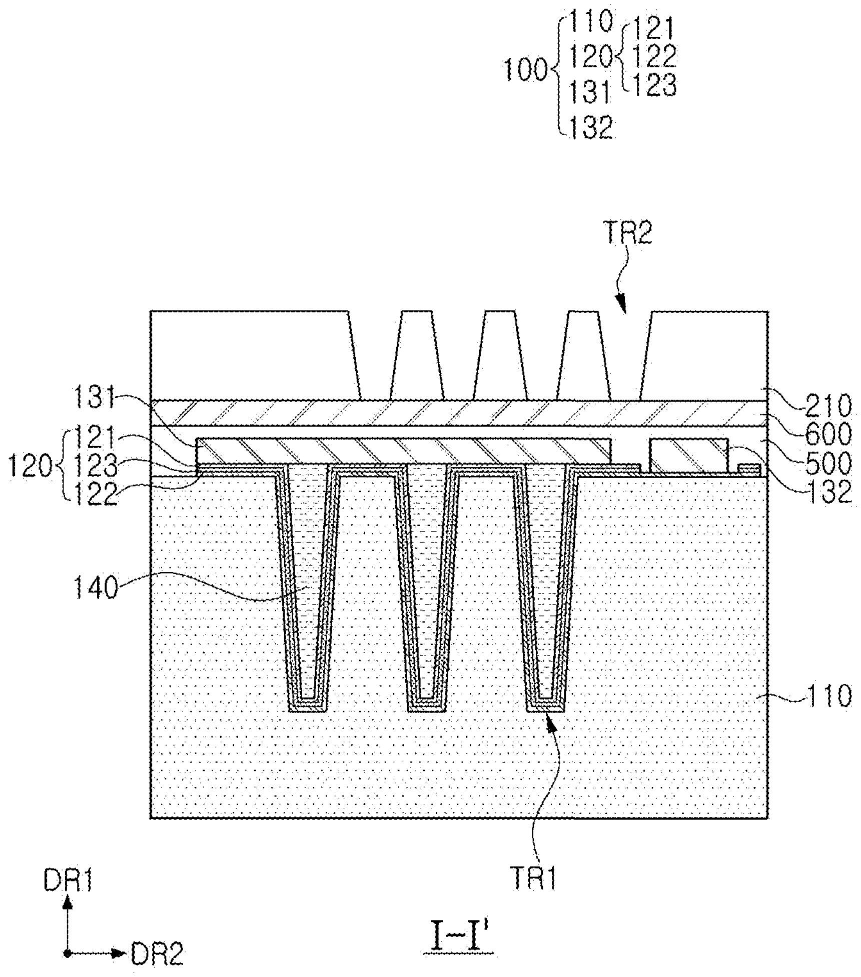

Next, referring to FIGS. 11 and 12, an insulating layer 210 may be formed by depositing silicon oxide on the intermediate metal film 600. In addition, similar to the process of forming the first trench TR1, an upper surface of the insulating layer 210 may be etched using a mask pattern and etching equipment to form a plurality of second trenches TR2 penetrating into the substrate 110 based on a second direction DR2.

Figure 13:
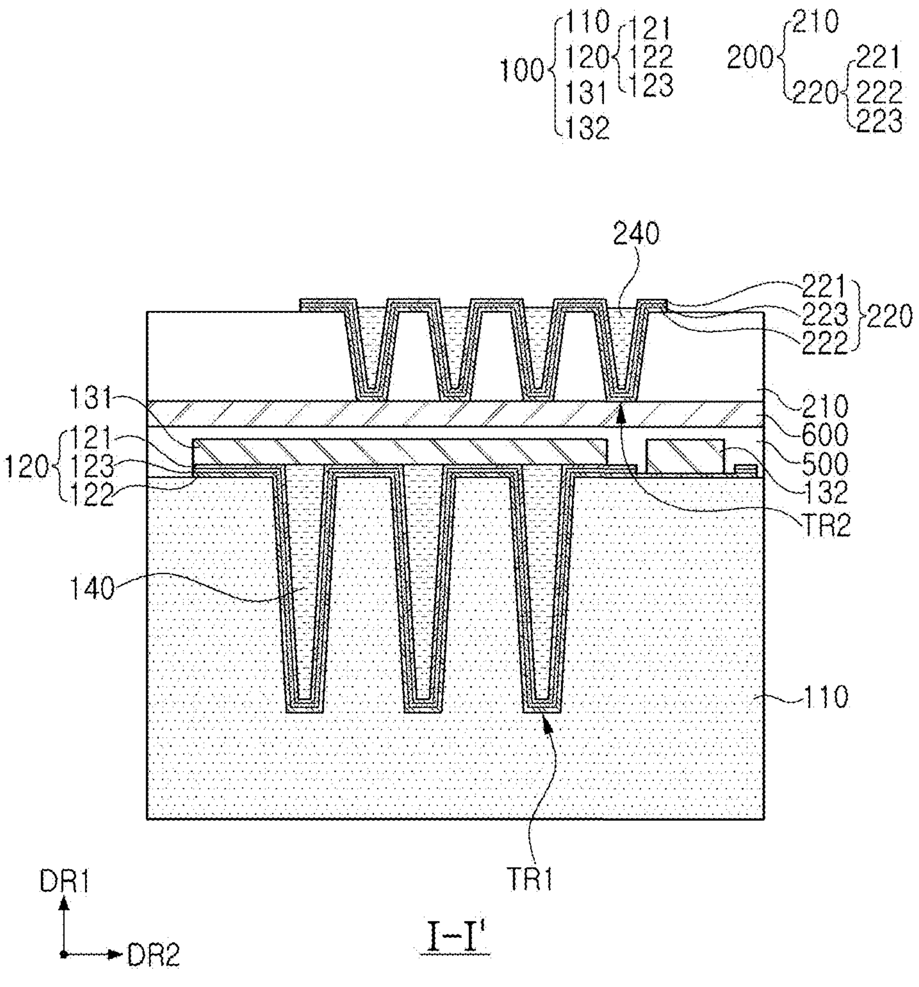

Thereafter, as illustrated in FIG. 13, a fourth electrode 222, a second dielectric layer 223, and a third electrode 221 may be sequentially deposited using an atomic layer deposition (ALD) process, an atomic vapor deposition (AVD) process, or the like, on an upper surface of the insulating layer 210 and inner walls of the plurality of second trenches TR2 to form a second capacitor layer 220, so that a second capacitor structure 200 may be manufactured. Thereafter, a second conductive filler 240 may be formed to fill an empty space inside the plurality of second trenches TR2.

Figure 14:
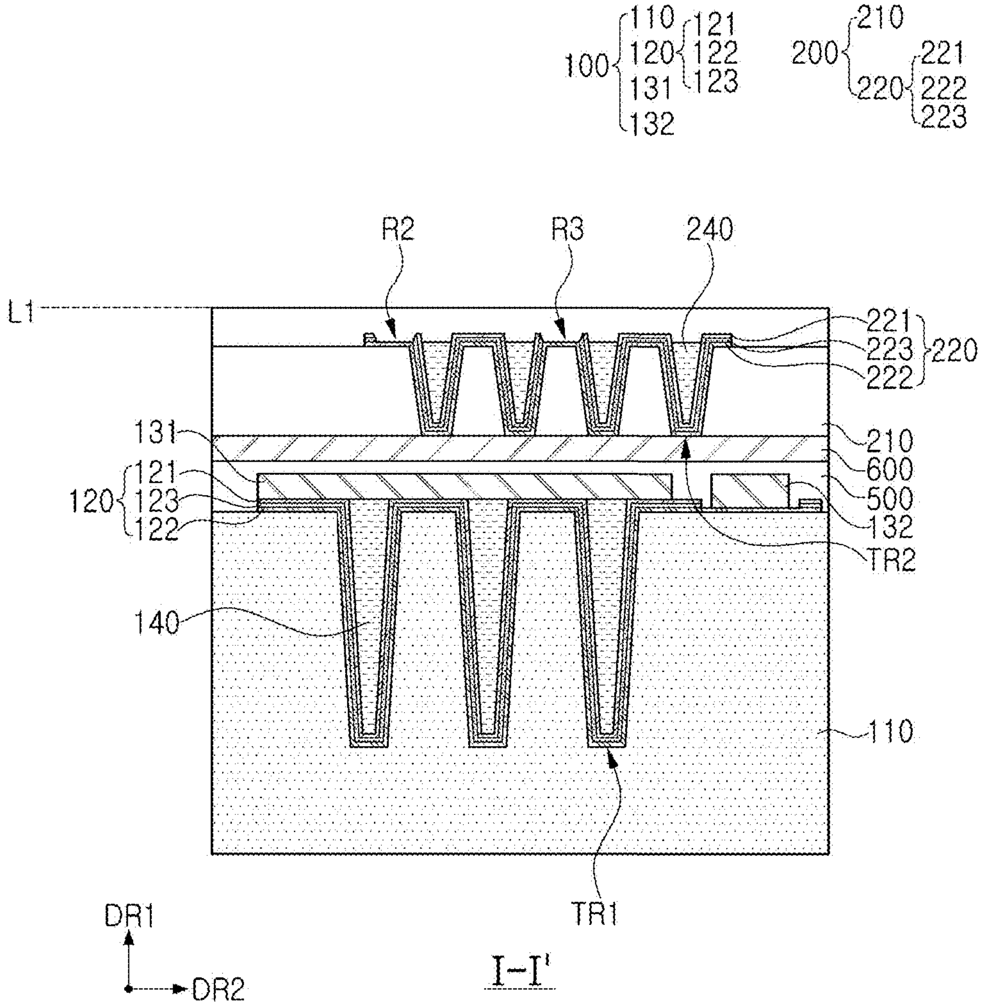

Next, referring to FIG. 14, before forming an upper insulating film, the third electrode 221 and the second dielectric layer 223 may be removed in partial regions R2 and R3 of the second capacitor layer 220 disposed on the upper surface of the insulating layer 210, to expose the fourth electrode 222 to the upper surface of the fourth electrode 222. Thereafter, silicon oxide may be deposited to deposit the upper insulating film up to a first level (L1).

Figure 15:
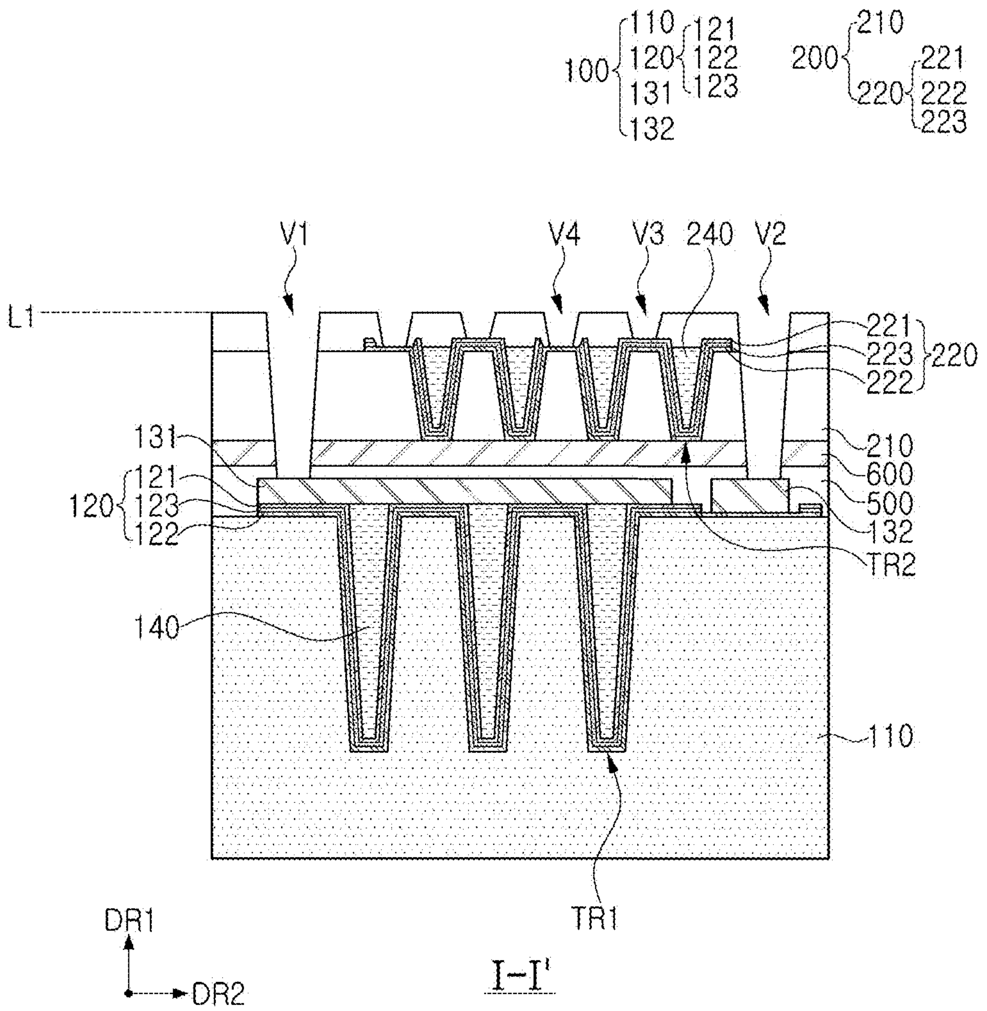

Thereafter, referring to FIG. 15, a first via V1 and a second via V2 penetrating through the upper insulating film, the insulating layer 210, the intermediate metal film 600, and the intermediate insulating film 500 may be formed to form first and second wiring structures. In addition, to form third and fourth wiring structures, a plurality of third vias V3 penetrating an upper surface of the upper insulating film to expose the third electrode 221 and a plurality of fourth vias V4 penetrating through the upper surface of the upper insulating film to expose partial regions R2 and R3 of the second capacitor layer from which the second dielectric layer 223 and the third electrode 221 are removed, may be formed.

Figure 16:
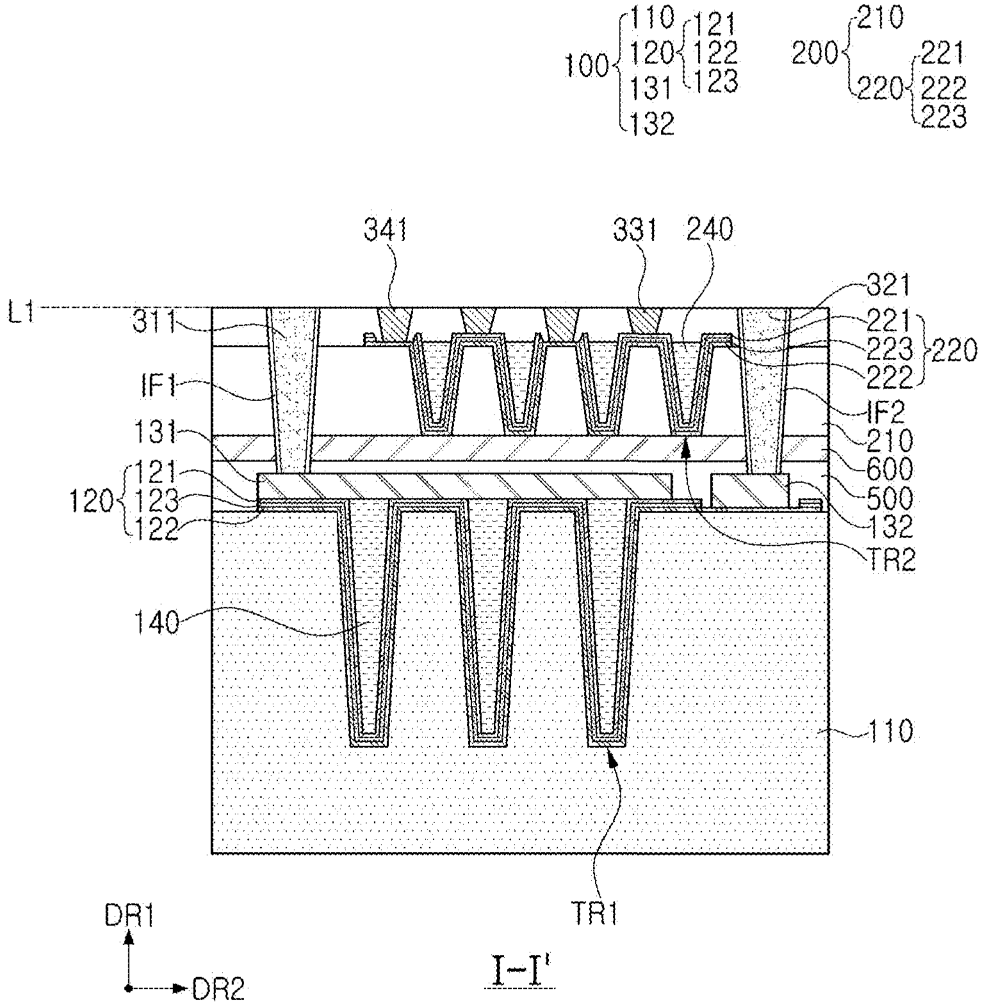

Next, as illustrated in FIG. 16, after forming first and second separators IF1 and IF2 on inner surfaces of the first via V1 and the second via V2, respectively, first and second via electrodes 311 and 321 may be formed. In addition, a third wiring layer 331 and a fourth wiring layer 341 may be formed in the third and fourth vias V3 and V4. Accordingly, an upper surface of each of the first via electrode 311, the second via electrode 321, the third wiring layer 331, and the fourth wiring layer 341 may be coplanar, but the present disclosure is limited thereto.

Figure 17:
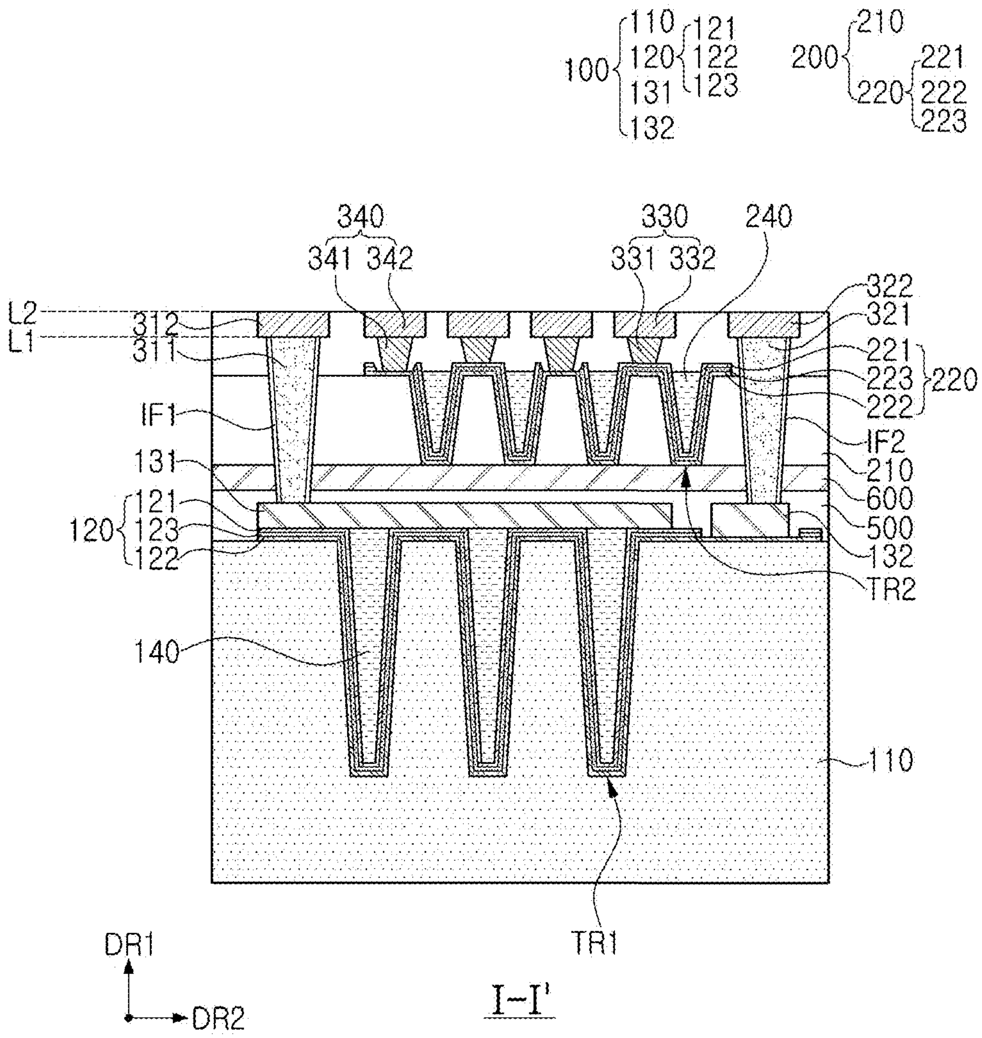

Thereafter, as illustrated in FIG. 17, after performing a process of depositing silicon oxide to deposit an upper insulating film to a second level L2 and etching partial regions, and then first to fourth wiring layers 312, 322, 332, and 342 may be formed. Accordingly, an upper surface of each of the first to fourth wiring layers 312, 322, 332, and 342 may be coplanar, but the present disclosure is not limited thereto.

Figure 18:
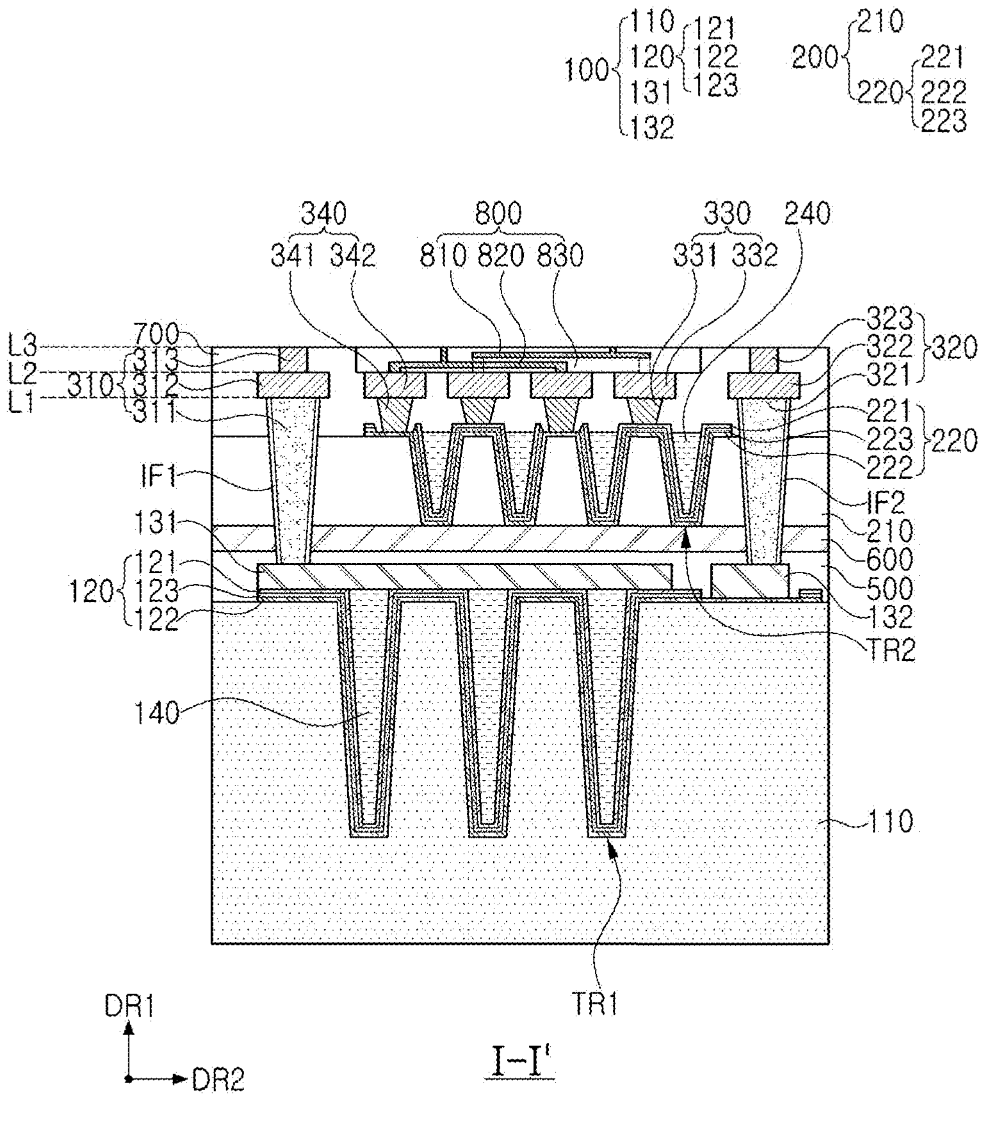

In addition, as illustrated in FIG. 18, after performing a process of depositing silicon oxide to deposit an upper insulating film 700 up to a third level L3 and etching partial regions, and then first and second wiring layers 313 and 333 and a circuit layer 800 may be disposed. Thereafter, by forming first to fourth external electrodes, the capacitor component of FIG. 2 may be manufactured.

However, the present disclosure is not limited thereto, and a process of forming the upper insulating film 700 may vary depending on the configuration or size of the first to fourth wiring structures 310, 320, 330, and 340 and the circuit layer 800. Alternatively, the first to fourth wiring structures 310, 320, 330, and 340 and the circuit layer 800 may be formed after the upper insulating film 700 is integrally formed.

As set forth above, as one of various effects of the present disclosure, capacitance of a capacitor component may be improved and crack occurrence may be prevented.

As one of various effects of the present disclosure, ESL of a capacitor component may be reduced.

In the present specification, the expression 'an embodiment' used in the present disclosure does not mean the same embodiment, and is provided to emphasize and describe different unique characteristics. However, an embodiment presented above is not excluded from being implemented in combination with features of another embodiment. For example, even if a matter described in one specific embodiment is not described in another embodiment, it can be understood as a description related to another embodiment, unless there is a description contradicting or contradicting the matter in the other embodiment.

In the present disclosure, the meaning of connected is a concept that includes not only directly connected, but also indirectly connected through an adhesive layer, or the like. In addition, the meaning of being electrically connected is a concept that includes both cases in which it is physically connected and cases in which it is not connected.

In addition, expressions such as first, second, and the like, are used to distinguish one component from another component and do not limit the order and/or importance of the components. In some cases, the first component may be referred to as the second component, and similarly, the second component may be referred to as the first component without departing from the scope of rights.

While example embodiments have been shown and described above, it will be apparent to those skilled in the art that modifications and variations could be made without departing from the scope of the present invention as defined by the appended claims.

What is claimed is:

1. A capacitor component, comprising:

a first capacitor structure including a substrate having a plurality of first trenches disposed on one surface of the substrate, and a first capacitor layer disposed on the one surface of the substrate and inner walls of the plurality of first trenches, the first capacitor layer including a first dielectric layer and first and second electrodes disposed to face each other with the first dielectric layer interposed therebetween;

a second capacitor structure disposed on the first capacitor structure, and including an insulating layer having a plurality of second trenches disposed on one surface of the insulating layer, and a second capacitor layer disposed on the one surface of the insulating layer and inner walls of the plurality of second trenches, the second capacitor layer including a second dielectric layer and third and fourth electrodes disposed to face each other with the second dielectric layer interposed therebetween;

first and second wiring structures penetrating through the insulating layer;

first and second external electrodes disposed on the insulating layer, and respectively connected to the first and second electrodes through the first and second wiring structures; and third and fourth external electrodes disposed on the insulating layer, and respectively connected to the third and fourth electrodes.

2. The capacitor component of claim 1, wherein the substrate is a silicon substrate, and the insulating layer comprises silicon oxide.

3. The capacitor component of claim 1, wherein when an interval between adjacent trenches among the plurality of first trenches is D1, an interval between adjacent trenches among the plurality of second trenches is D2, a depth of a trench among the plurality of first trenches is T1, and a depth of a trench among the plurality of second trenches is T2, $D1>D2$ and/or $T1>T2$ are satisfied.

4. The capacitor component of claim 1, wherein the first capacitor structure further includes:

a first connection electrode disposed to be in contact with the first electrode and connecting the first electrode and the first wiring structure, and a second connection electrode disposed to be in contact with the second electrode and connecting the second electrode and the second wiring structure.

5. The capacitor component of claim 4, wherein the first wiring structure comprises:

a first via electrode penetrating through the insulating layer, wherein one end of the first via electrode is in contact with the first connection electrode, and a plurality of first wiring layers stacked on the first via electrode, and the second wiring structure comprises:

a second via electrode penetrating through the insulating layer, wherein one end of the second via electrode is in contact with the second connection electrode, and a plurality of second wiring layers stacked on the second via electrode.

6. The capacitor component of claim 5, further comprising:

a first separator disposed on an outer surface of the first via electrode, and a second separator disposed on an outer surface of the second via electrode.

7. The capacitor component of claim 1, wherein an interior of the plurality of first trenches is filled with a first conductive filler, and an interior of the plurality of second trenches is filled with a second conductive filler.

8. The capacitor component of claim 1, further comprising:

an intermediate insulating film including silicon oxide and disposed to cover the first capacitor structure.

9. The capacitor component of claim 8, further comprising:

an intermediate metal film disposed between the intermediate insulating film and the second capacitor structure.

10. The capacitor component of claim 9, wherein the plurality of second trenches penetrate through the insulating layer, and the fourth electrode and the intermediate metal film are in contact on lower surfaces of the plurality of second trenches.

11. The capacitor component of claim 1, further comprising:

a plurality of third wiring structures connecting the third electrode and the third external electrode, and spaced apart from each other, a plurality of fourth wiring structures connecting the fourth electrode and the fourth external electrode, and spaced apart from each other, and a circuit layer connecting the plurality of third wiring structures and the third external electrode, and connecting the plurality of fourth wiring structures and the fourth external electrode.

12. The capacitor component of claim 11, wherein the circuit layer comprises:

a first circuit pattern connecting the plurality of third wiring structures and the third external electrode, and a second circuit pattern connecting the plurality of fourth wiring structures and the fourth external electrode.

13. The capacitor component of claim 1, further comprising:

an upper insulating film disposed between an upper surface of the insulating layer and lower surfaces of the first to fourth external electrodes and covering at least a portion of the first and second wiring structures.

14. The capacitor component of claim 1, wherein the first to fourth external electrodes respectively includes a plurality of external electrodes, and the plurality of first external electrodes is connected to the first electrode.

15. A capacitor component, comprising:

a first capacitor structure including a substrate having a plurality of first trenches disposed on one surface of the substrate, and a first capacitor layer disposed on the one surface of the substrate and inner walls of the plurality of first trenches, the first capacitor layer including a first dielectric layer and first and second electrodes disposed to face each other with the first dielectric layer interposed therebetween;

a second capacitor structure disposed on the first capacitor structure, and including an insulating layer having a plurality of second trenches disposed on one surface of the insulating layer, and a second capacitor layer disposed on the one surface of the insulating layer and inner walls of the plurality of second trenches, the second capacitor layer including a second dielectric layer and third and fourth electrodes disposed to face each other with the second dielectric layer interposed therebetween, first and second external electrodes disposed on the insulating layer, and connected to the first and second electrodes, respectively; and third and fourth external electrodes disposed on the insulating layer, and connected to the third and fourth electrodes, respectively, wherein the insulating layer includes silicon oxide, and when an interval between adjacent trenches among the plurality of first trenches is D1, an interval between adjacent trenches among the plurality of second trenches is D2, a depth of a trench among the plurality of first trenches is T1, and a depth of a trench among the plurality of second trenches is T2, $D1>D2$ and/or $T1>T2$ are satisfied.

16. The capacitor component of claim 15, further comprising:

first and second wiring structures penetrating through the insulating layer, wherein the first and second external electrodes are connected to the first and second electrodes, respectively, through the first and second wiring structures, respectively.

17. The capacitor component of claim 16, wherein the first wiring structure comprises:

a first via electrode penetrating through the insulating layer, and a plurality of first wiring layers stacked on the first via electrode, and the second wiring structure comprises:

a second via electrode penetrating through the insulating layer, and a plurality of second wiring layers stacked on the second via electrode.

18. The capacitor component of claim 17, wherein the first wiring structure does not connect the first electrode to the third electrode.

19. The capacitor component of claim 17, wherein the second wiring structure does not connect the second electrode to the fourth electrode.

20. The capacitor component of claim 16, wherein the first to fourth external electrodes respectively includes a plurality of external electrodes, and the plurality of first external electrodes is connected to the first electrode.

* * * * *